(12) United States Patent
Fairbairn

(10) Patent No.: US 9,111,979 B2
(45) Date of Patent: Aug. 18, 2015

(54) SYSTEM AND METHOD FOR REAL TIME POSITIONING OF A SUBSTRATE IN A VACUUM PROCESSING SYSTEM

(71) Applicant: Kevin P Fairbairn, Los Gatos, CA (US)

(72) Inventor: Kevin P Fairbairn, Los Gatos, CA (US)

( * ) Notice: Subject to any disclaimer, the term of this patent is extended or adjusted under 35 U.S.C. 154(b) by 273 days.

(21) Appl. No.: 13/896,001

(22) Filed: May 16, 2013

(65) Prior Publication Data

US 2014/0340509 A1  Nov. 20, 2014

(51) Int. Cl.
| | |
|---|---|
| H01L 21/68 | (2006.01) |
| H01L 21/673 | (2006.01) |
| H05K 13/00 | (2006.01) |
| H04N 7/18 | (2006.01) |
| G06T 7/00 | (2006.01) |
| H04N 5/335 | (2011.01) |
| H04N 17/00 | (2006.01) |

(52) U.S. Cl.
CPC ............ *H01L 21/681* (2013.01); *G06T 7/0004* (2013.01); *G06T 7/0018* (2013.01); *G06T 7/0042* (2013.01); *H01L 21/67356* (2013.01); *H04N 5/335* (2013.01); *H04N 7/18* (2013.01); *H04N 17/002* (2013.01); *H05K 13/0069* (2013.01); *G05B 2219/45031* (2013.01); *G06T 2207/30148* (2013.01)

(58) Field of Classification Search
CPC ................... H01L 21/67259; H01L 21/67265; H01L 21/67353; H01L 21/67356; H01L 21/67763; H01L 21/67766; H01L 21/681; H05K 13/0015; H05K 13/0069; H05K 13/08; H05K 13/0413; G05B 2219/45031; G05B 2219/45032

USPC ................. 348/87, 94, 95; 700/112, 114, 121
See application file for complete search history.

(56) References Cited

U.S. PATENT DOCUMENTS

| | | | | |
|---|---|---|---|---|
| 6,215,897 | B1 * | 4/2001 | Beer et al. ...................... | 382/151 |
| 6,298,280 | B1 * | 10/2001 | Bonora et al. ................ | 700/218 |
| 6,405,101 | B1 * | 6/2002 | Johanson et al. ............ | 700/218 |
| 7,233,841 | B2 * | 6/2007 | Sadighi et al. ................ | 700/245 |
| 7,813,542 | B2 * | 10/2010 | Lee et al. ...................... | 382/151 |
| 7,933,665 | B2 * | 4/2011 | Sakiya et al. .................. | 700/57 |
| 8,016,541 | B2 * | 9/2011 | Coady ......................... | 414/744.5 |
| 8,125,652 | B2 * | 2/2012 | Fogel et al. ................... | 356/614 |
| 8,125,653 | B2 * | 2/2012 | Weniger et al. ............... | 356/621 |
| 8,452,077 | B2 * | 5/2013 | Ravid et al. .................. | 382/152 |
| 8,731,718 | B2 * | 5/2014 | Rodnick ....................... | 700/253 |
| 2003/0198376 | A1 * | 10/2003 | Sadighi et al. ................ | 382/153 |
| 2003/0202092 | A1 * | 10/2003 | Sadighi et al. ................ | 348/87 |
| 2005/0021177 | A1 * | 1/2005 | Bacchi et al. ................ | 700/245 |
| 2005/0058367 | A1 * | 3/2005 | Fujimoto ...................... | 382/276 |
| 2005/0110291 | A1 * | 5/2005 | Klein et al. .................. | 294/64.1 |
| 2007/0029227 | A1 * | 2/2007 | Bonora ......................... | 206/711 |

(Continued)

FOREIGN PATENT DOCUMENTS

| | | | |
|---|---|---|---|
| JP | 2007276113 | A * | 10/2007 |
| JP | 2009088184 | A * | 4/2009 |

(Continued)

*Primary Examiner* — John Villecco

(57) ABSTRACT

An improved position control means for robotic handling systems; particularly, a sensing system and method for precisely determining the center point of a substrate, such as a semiconductor wafer, relative to a destination point by using a set of multi pixel imaging sensors incorporated into the wafer carrying end effector of the robotic handling system.

16 Claims, 12 Drawing Sheets

(56) References Cited

U.S. PATENT DOCUMENTS

| | | | |
|---|---|---|---|
| 2010/0085582 A1* | 4/2010 | Weniger et al. | 356/621 |
| 2011/0199477 A1* | 8/2011 | Ravid et al. | 348/87 |
| 2012/0154822 A1* | 6/2012 | Kiley et al. | 356/614 |
| 2013/0085595 A1* | 4/2013 | Kiley et al. | 700/121 |
| 2013/0138238 A1* | 5/2013 | Yang | 700/114 |
| 2013/0215258 A1* | 8/2013 | GAGLIN et al. | 348/87 |
| 2014/0174351 A1* | 6/2014 | AIKAWA, Katsuyoshi | 118/713 |

FOREIGN PATENT DOCUMENTS

| | | | |
|---|---|---|---|
| JP | 2011009345 A | * | 1/2011 |
| KR | 2006027699 A | * | 3/2006 |
| KR | 2007109447 A | * | 11/2007 |

\* cited by examiner

SYSTEM AND METHOD FOR REAL TIME POSITIONING OF A SUBSTRATE IN A VACUUM PROCESSING SYSTEM

CROSS REFERENCE TO RELATED APPLICATIONS

Not Applicable.

BACKGROUND OF INVENTION

Field of the Invention

This invention relates generally to an improved position control means for robotic handling systems and more particularly, to an improved system and method for transferring a substrate such as a wafer to a predetermined position in a vacuum processing system.

REFERENCES CITED

US. Patent Documents

| | | | |
|---|---|---|---|
| 4,819,167 A | April 1989 | Cheng et al. | 364/167.01 |
| 4,833,790 A | May 1989 | Spencer et al. | 33/520 |
| 4,871,955 A | October 1989 | Berger | 318/640 |
| 4,955,780 A | September 1990 | Shimane et al. | 414/744.2 |
| 4,980,626 A | December 1990 | Hess et al. | 318/568.16 |
| 5,198,740 A | March 1993 | Jacobsen et al. | 318/687 |
| 5,483,138 A | January 1996 | Shmookler et al. | 318/568.16 |
| 5,540,821 A | July 1996 | Tepman | 204/192 |
| 5,636,964 A | June 1997 | Somekh et al. | 414/786 |
| 5,706,201 A | January 1998 | Andrews | 700/108 |
| 5,740,062 A | April 1998 | Berkin et al | 700/218 |
| 5,915,915 A | June 1999 | Allen et al. | 414/744.1 |
| 5,917,601 A | June 1999 | Shimazaki et al. | 356/622 |
| 5,980,194 A | November 1999 | Freerks et al. | 414/754 |
| 5,995,234 A | November 1999 | Nishi | 356/401 |
| 6,075,334 A | June 2000 | Sagues et al. | 318/568 |
| 6,198,976 B1 | March 2001 | Sundar et al. | 700/59 |
| 6,327,517 B1 | December 2001 | Sundar | 700/245 |
| 6,392,810 B1 | May 2002 | Tanaka | 359/622 |
| 6,405,101 B1 | June 2002 | Johanson et al. | 700/218 |
| 66/556,887 B2 | April 2003 | Freeman et al. | 700/218 |
| 6,591,161 B2 | July 2003 | Hine et al. | 700/218 |
| 6,591,161 B2 | July 2003 | Yoo et al. | 700/218 |
| 6,629,053 B1 | September 2003 | Mooring | 702,94 |
| 6,697,517 B1 | February 2004 | Hunter | 382/149 |
| 6,819,938 B2 | November 2004 | Sahota et al. | 455/522 |
| 7,008,802 B2 | March 2006 | Lu | 438/7 |
| 7,248,931 B2 | July 2007 | Raaijimakers | 700/57 |
| 7,315,373 B2 | January 2008 | Fukuzaki et al. | 356/399 |
| 7,433,759 B2 | October 2008 | Nangoy | 700/245 |
| 7,933,665 B2 | April 2011 | Sakiya et al. | 700/57 |
| 8,121,078 B2 | February 2012 | Siann et al. | 370/328 |
| 8,260,461 B2 | September 2012 | Krishnasamy et al. | 700/254 |

DESCRIPTION OF PRIOR ART

The semiconductor industry is a multi-hundred billion dollar per year industry and very capital intensive. The biggest cost element of manufacturing semiconductors is equipment depreciation. It takes 300 or more process steps to make a semiconductor chip with the majority of the process steps taking place in vacuum processing systems. These vacuum processing systems suffer downtime which is economically undesirable due to the lost manufacturing time and labor costs associated with dealing with the downtime causes. Downtime, typically 10% of the total time, is split between "scheduled downtime" for cleaning, process kit replacement and recalibration and "unscheduled downtime" typically due to failures and or process moving out of specification and requiring corrective action. A significant portion of the time and labor costs associated with vacuum processing system downtime recovery is due to manual recalibration of the vacuum wafer transfer robot to ensure accurate handoffs of the wafer onto process chamber pedestals which is critical for reliability and achievement of process specifications. Pedestals can take the form of heaters or electrostatic chucks for example. The installed capital base of semiconductor vacuum process systems exceeds one hundred billion dollars and it is conservatively estimated that the vacuum robot recalibration time consumes 2% of the available productive time or over 2 billion dollars of idle capital equipment; therefore robot recalibration is a serious economic problem.

The placement accuracy of a wafers onto a pedestal is critical to the attainment of good manufacturing yield. The wafer must be placed with great accuracy as described in U.S. Pat. No. 7,248,931 by Raaijmakers. This need for accurate placement is becoming even more critical as semiconductor design rules get smaller since the semiconductor device micro structures at the edge of the wafer are very influenced by the concentricity and symmetry of the wafer to the wafer processing hardware.

The problems just described, are not limited to semiconductor processing, they apply to other substrates processed inside vacuum processing systems. It is an object of the invention to address the significant cost and downtime associated with manually recalibrating the wafer transfer robot by providing an intelligent sensing system incorporated into the robot's wafer carrying end effector that eliminates the need to manually recalibrate the robot when the vacuum processing system is serviced. A further object of this invention is too improve the accuracy and repeatability of wafer placement within a vacuum processing system.

In a vacuum processing system, a transfer robot is used to transport a substrate, such as a silicon wafer, from one location to another inside the system. Wafers enter the system through a vacuum load lock. The wafers are either placed inside the load lock by an atmospheric robot as described in U.S. Pat. No. 7,933,655, by Sakiya et al. or a cassette of wafers is placed into the load lock, or alternately wafers may be manually placed. When a cassette is not used, the individual wafers are typically placed in or on a rack in the loadlock that may hold one or more wafers. The load lock is pump down to vacuum and the wafers can now be moved in and out of the loadlock by the wafer transfer robot. The transfer robot includes an end effector to carry the wafer from the cassette or wafer rack in the load lock and transfer it to a process chamber directly, or via an intermediate staging position, and after processing is complete, transfer the wafer back eventually to the cassette or rack inside the load lock.

The wafer is typically loosely located between two shoes, having bevelled contours shape, to accommodate the wafer on the robot end effector as described in U.S. Pat. No. 5,636,964 by Somekh and in other prior art descriptions. This is for two main reasons. Firstly, the wafer is typically at room temperature when removed from the load lock however the wafer may be hot when the wafer is removed from the process chamber pedestal, as high as 400 to 700 degrees Centigrade for some high temperature processes. The hot wafer's diameter grows and this larger wafer must be accepted by the pocket formed between the two shoes on the end effector. The second reason for the loose fit of the wafer between the end effector shoes is that the end effector must deal with small variations in the wafer's position when it picks the wafer up from the process chamber or staging location or loadlock.

The wafer when being transported on the robot's end effector is therefore not precisely located and the actual position of the wafer has to be determined by sensors, so that the transfer robot can be controlled to position the wafer precisely at its target destination.

In the prior art, there are several ways to measure the position of the wafer on the robot's end effector before the wafer is moved into the process chamber, or onto the staging position or into the load lock. It is desirable for contamination reasons to avoid any physical contact with the wafer, so optical systems are widely used as described in U.S. Pat. No. 4,819,167 Cheng et al. and U.S. Pat. No. 5,740,062 Berkin et al. In this prior art, multiple optical through beam sensors, comprised of light transmitters and receivers, are used. If the light beam from the transmitter is blocked by the edge of the wafer passing between the transmitter and receiver, the sensor detects the interruption and sends a signal to the computer. The computer calculates the "true" position of the wafer relative to the robot's end effector and provides modified commands to the transfer robot to place the wafer at target coordinates at the destination location such as a process chamber.

Another approach is described in U.S. Pat. No. 7,248,931 by Raaijmakers, where instead of using multiple light beams, a fix camera system detects the edge of the wafer relative to fix alignment marks to provide feedback to the robot controller so modified position commands can be made to the robot.

The prior art for accurate wafer positioning and placement into process chambers, load locks and staging locations has multiple and significant shortcomings.

Firstly, the measurement of the wafer position is undertaken in the chamber containing the transfer robot and not in the actual chamber or at the actual location where the wafer is going to be placed. The prior art assumes that the wafer does not move on the robot's end effector. In practice, sliding can occur when the robot changes velocity resulting in loss of wafer placement accuracy. Wafer sliding can be caused by the coefficient of friction between the wafer and robot end effector surface changing with time due to wear. In addition, customers constantly push to increase the speed of the wafer transfer robot for increased productivity which can result in the accelerations and decelerations of the robot increasing to the point where the margin of safety to avoid wafer sliding on the end effector is compromised. In addition, electronic jitter from the robot control system or mechanically induced jitter can cause the wafer to move on the end effector.

Secondly, the prior art makes the wafer position measurement while the robot is moving resulting in reduced measurement accuracy due to the latency in the signal processing of the sensor signals relative to the robot's position encoder output signals.

Thirdly, all the prior art solutions require that the robot destination target coordinates be previously taught and the robot control system simply has to modify the robot's target coordinates to allow for the wafer drift in position on the robot's end effector. The teaching of the robot's target drop off and pick up coordinates requires the vacuum process system's wafer transfer chamber and or the process chamber be vented to atmosphere so that a service engineer can perform the robot teaching calibration. It is possible for the destination hardware and the robot's end effector to change relative positions based upon the pressure in the process chamber thus impacting the accuracy of wafer positioning. This calibration has to be performed if process kit hardware or robot hardware is disturbed or in some instances where the process has drifted out of specification. This calibration adds to the downtime of the system and requires the use of expert service engineers.

Lastly, when the processing system is in production, the critical handoff of a wafer onto a wafer pedestal is done blindly. There are no sensors present in the process chamber to assist the accuracy of placement. For the majority of semiconductor processes, it is virtually impossible to place the appropriate windows in the process chambers so that the prior art alignment methods could be used at the point of wafer handoff. This is because the environment in many process chambers is extremely corrosive to window materials, and in non-corrosive environments the windows can become obscured by byproduct depositions from the process. Additionally, in many instances the design requirements of the process chamber designs preclude adding discrete windows.

A need exists for a simple and robust sensing solution that accurately positions the wafer, carried on the robot's end effector, at the destination target position in the process chamber, load lock and or staging location and does not require time consuming and expensive robot manual calibrations involving venting the vacuum processing system.

BRIEF SUMMARY OF THE INVENTION

Unlike the prior art which utilizes either static sensors or cameras detached from the transfer robot, this invention incorporates imaging sensors in the end effector of a wafer transfer robot to enable real time information about the exact position of the wafer on the end effector and the exact position of the robot's end effector relative to the physical hardware to which the wafer will be placed upon or removed from. This positional information can be used to automatically modify the robot's position to ensure accurate wafer handoffs. The invention requires no manual sensor positional calibration beyond the initial calibration following build of the robot's end effector.

This invention enables the ability to take images inside the process chamber of the actual position of the wafer on the process pedestal without breaching vacuum or opening the chamber.

This invention also solves multiple challenges to using imaging sensors mounted on a wafer transfer robot in a vacuum system, namely, no use of cables for power and signal connectivity, no increase in thickness of the end effector and how to increase wafer positioning accuracy.

The ability to "wirelessly" provide power and send and receive signals is accomplished through the use of photovoltaic cells mounted on the robot powered by a remote light source to produce the required electric power. Wireless signal communications are utilized.

The end effector carrying the wafer must be thin as is known in the art and this sensing system solution cannot increase the thickness. This is solved by using a wafer facing imaging sensor without any optics, and simply placing the sensor under a small portion of the edge of the wafer. The other imaging sensor which determines the end effector location relative to the wafer handoff hardware, is able to be small by virtue of the stand off distance combined with a small field of view.

The accuracy of the wafer positioning is improved by using multi pixel sensors with very small pixels and 8 bit light sensitive (256 gray levels) pixels that enable micron level resolution.

DETAILED DESCRIPTION OF THE INVENTION

Although the following description describes the invention in terms of a semiconductor wafer substrate, this is for illustration only and other substrates or objects to be transferred to a preselected location can be substituted therefor, as will be known to one skilled in the art. The following description illustrates the invention with a wafer above the robot's end effector in a horizontal format for ease of explanation. In practice, the orientation of this invention can be in any plane.

Figure 1A:
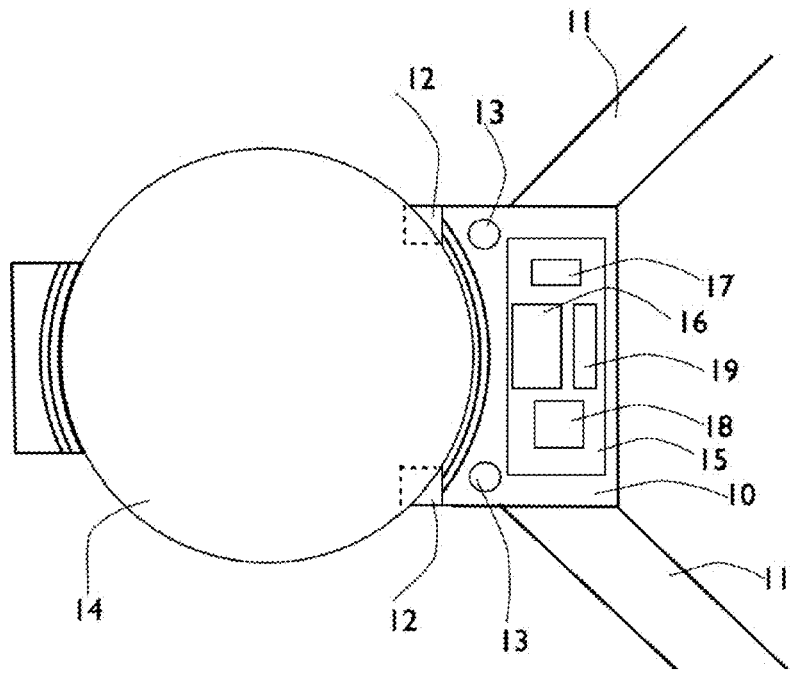
FIG. 1A is a top down view of the end effector assembly of this invention with two wafer facing multi-pixel sensors partially obscured by a wafer.
Figure 2:
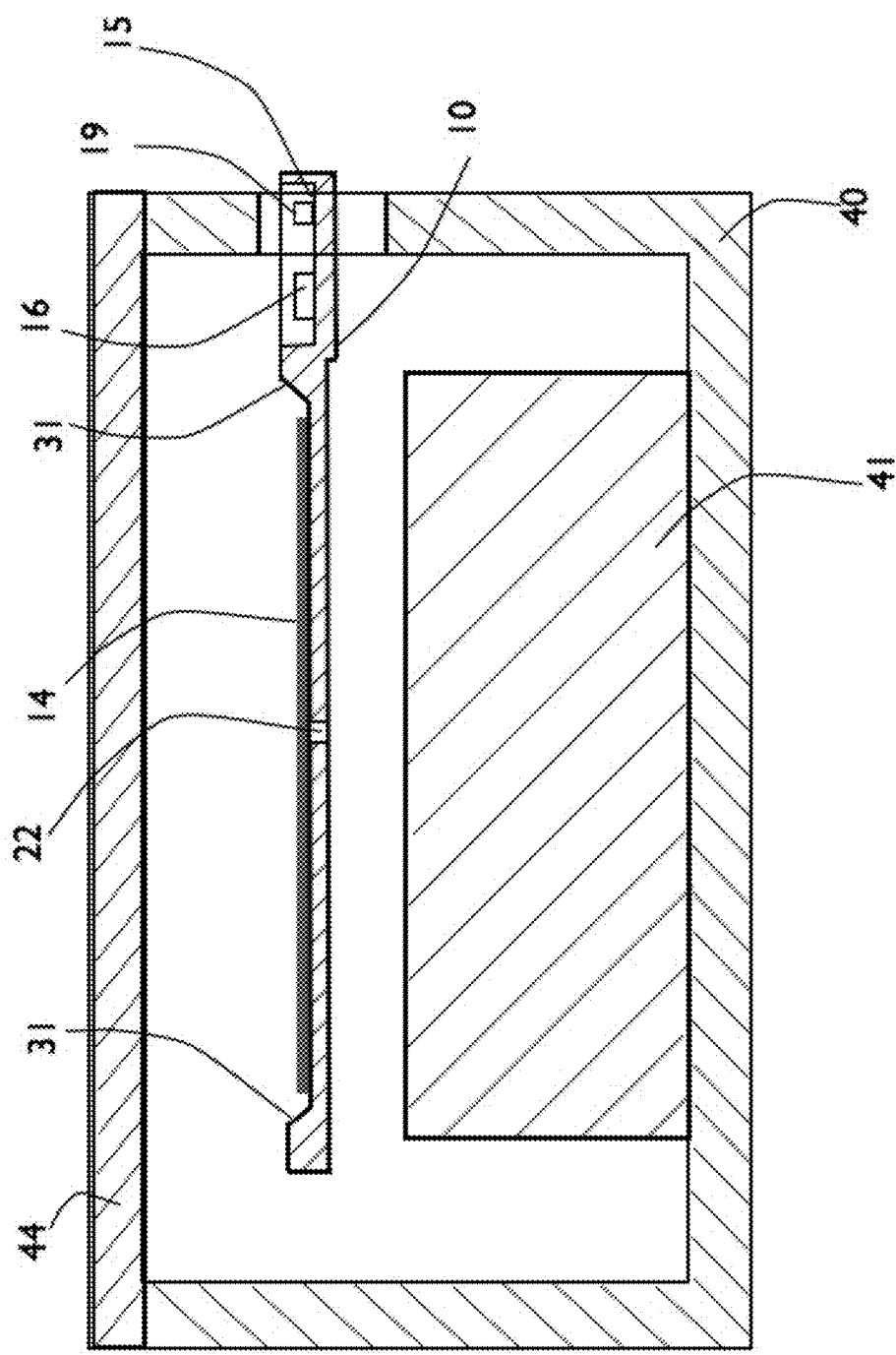
FIG. 2 is a cross section through the center line the end effector assembly sitting above a pedestal inside a process chamber.

The end effector assembly 10 carrying a wafer 14 is shown in FIGS. 1A and 2. The wafer 14 sits on top of the end effector assembly 10 between two optional locating shoes 31. The end effector assembly 10 connects to the wafer transfer robot assembly 50 by robot arms 11 shown in FIG. 3. Shown in FIG. 1A are two wafer facing multi-pixel sensors 12 which are partially obscured by the wafer edge. The invention can be accomplished with one sensor however if additional positional accuracy is required than more sensors 12 can be provided on the end effector assembly 10 overlapping the edge of the wafer 14. The remainder of the description will utilize one wafer facing sensor 12. Sensor 12 is proximity focused onto the edge of the wafer 14 avoiding the need for a lens assembly and thus minimizing the overall thickness of the imaging assembly, this is vitally important characteristic. Proximity focusing requires the wafer 14 be no more than 1 mm from the face of the sensor 12 and ideally almost touching the sensor face to maximize the wafer edge shadow intensity imaged by the multi-pixel array of sensor 12. The avoidance of the wafer actually touching the sensor face is for contamination reasons. Silicon is very hard and might scratch the sensor surface causing particles if the silicon wafer and sensor surface make contact.

It is important that the sensor 12 be thin enough to be compatible with the thin section of the end effector under the wafer. This need for a thin end effector under the wafer has been described in prior art. A typical dimension for the sensor 12 would be approximately 8 mm-15 mm rectangular and located on the end effector assembly 10 so that the wafer edge will ideally intersect two parallel axis of the sensor 12 if the wafer is positioned within the capture range of the locating shoes 31. The sensor 12 is typically less than 8 mm thick with an array of pixels 256 by 256 with individual pixels typically 50 microns or less in dimension. In practice, it may be more economical to use larger area, and or, higher resolution sensors that are available in the market at low cost. If multiple sensors are used, additional accuracy can be accomplished by the system, as additional analysis algorithms can be applied. While the preferred embodiment is to use small pixel sensors based upon CCD or CMOS imagers, it is also possible to use larger sensors with larger pixels based upon amorphous silicon sensors analogous to the multi pixel sensors used a digital X ray detection but with the sensor optimized to detect light and not x rays.

One or more illuminators 13, are positioned on the top of the end effector assembly 10 to produce sufficient light, reflected from the chamber lid 44 in FIG. 2 to produce a shadow of the wafer edge onto the multi-pixel array of sensor 12. If sufficient stray light is available then these illuminators can be eliminated. The wavelength of the light may have to optimized, either by moving more into the ultra-violet or into the near infrared, in the case of transparent substrates to improve the edge shadow definition.

While the invention's preferred embodiment is to use a light imaging multi-pixel array sensor 12, the sensor could be replaced with a capacitance measuring multi-electrode array which would not require any light present. Such a sensor is likely to have larger pixels than 50 micron so the sensor will be likely larger than 8 mm rectangular.

Figure 1B:
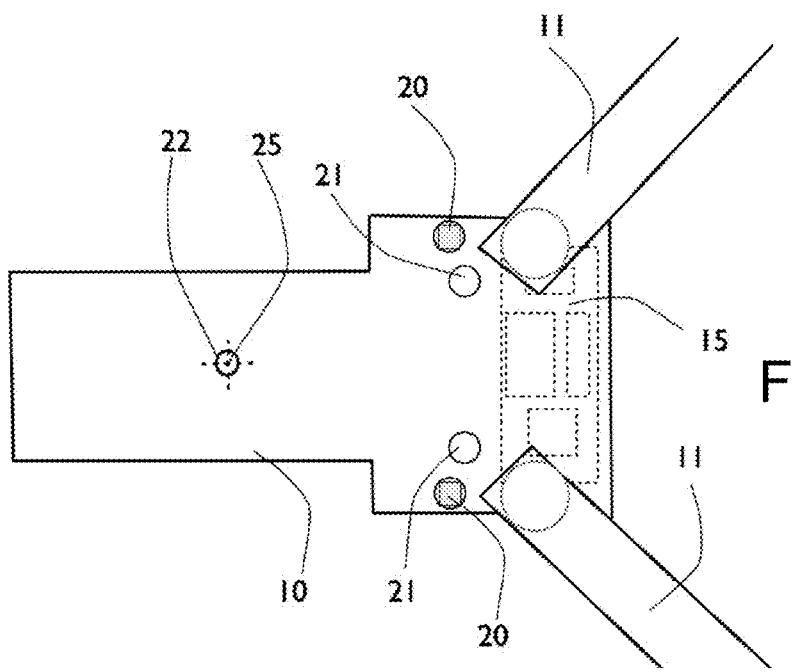
FIG. 1B is a bottom view of FIG. 1A without wafer present.

The underside of the end effector assembly 10 illustrated in FIG. 1B includes two multi-pixel imaging sensors 20 with associated lens system that look downwards. Associated with these sensors 20 are illuminators 21 in case there is insufficient stray light available for imaging. The center point 25 of the end effector assembly represents the point where the center of a wafer 14 would be if it was symmetrically placed on the end effector and between the shoes 31. A calibration hole 22 is concentric with point 25.

FIG. 2 shows a cross section of the end effector assembly 10 above a pedestal 41 inside a chamber 40. The downward facing sensor 20 is used in the determination the offset dimensional coordinates of the center point 49 of the pedestal 41 shown in FIG. 3 relative to the center point 25 of the end effector assembly 10. The sensors 20 would image a portion of the outer edge of the pedestal 41. Depending on the physical nature of the pedestal on which the wafer is going to be placed, other features might be chosen as the reference for determining the pedestal's center point. Typically in wafer processing systems, the portion of the end effector assembly 10 carrying the wafer 14 is 8 mm to 25 mm above the surface of the pedestal 41 when it is transferring wafers to or from the pedestal. This means that the multi-pixel imaging sensor 20 and associated optics must be optimized to the distance between the pedestal reference features and the sensor 20 so as to produce a field of view of at least 8 mm to 15 mm. The optics may require a focusing mechanism in certain applications. Sensors 20 and its associated optics are miniature in size and similar to those used in cell phone cameras and small cameras.

The preferred embodiment of the invention is to use two multi-pixel imaging sensors 20 and associated optics as this enables a means to see into the process chamber 40 without opening the chamber lid 44 and breaching vacuum. This is very advantageous for maintenance and trouble shooting. However, if this feature is not required, then the multi-array imaging sensors could be replaced by a simpler sensor using a light beam transmitter and receiver that detect the outside diameter of the pedestal 41 for example. Two sensors provide greater accuracy and viewing margin of the destination pedestal 41.

The sensors 12 and 20 are shown in an orthogonal orientation with respect to the center lines of the end effector assembly 10. In practice, they can be oriented at an angle to the center lines of the end effector assembly 10. In certain situations with clearly delineated features at the target destination, only one multi-pixel imaging sensor 20 and associated optics may be required. The choice of how many sensors 20 are utilized will depend on the trade off between how much of the pedestal is to be viewed, the accuracy required and the cost and complexity of additional sensors.

FIGS. 1A, 1B, 2 and 3 show a one piece end effector assembly 10 and one end effector assembly 10 attached to the robot assembly 50. This is for simplicity in describing the invention. In practice the end effector assembly 10 may comprise multiple elements, such a separate element of the end effector upon which the wafer 14 sits, with this element of the end effector being attached to the part of the end effector assembly which is attached to the robot arms 11. The robot assembly 50 may have multiple end effectors assemblies 10 attached to one set of robot arms 11, and or, multiple sets of robot arms 11 holding one or more end effector assemblies 10.

The control of the sensors 12, 20 and associated illuminators 13, 21, the processing of the sensor signals, the processing and storage of data and the communication of signals to and from the end effector assembly 10 is undertaken by the data processing and control module 15 mounted on the end effector assembly 10.

Figure 4:
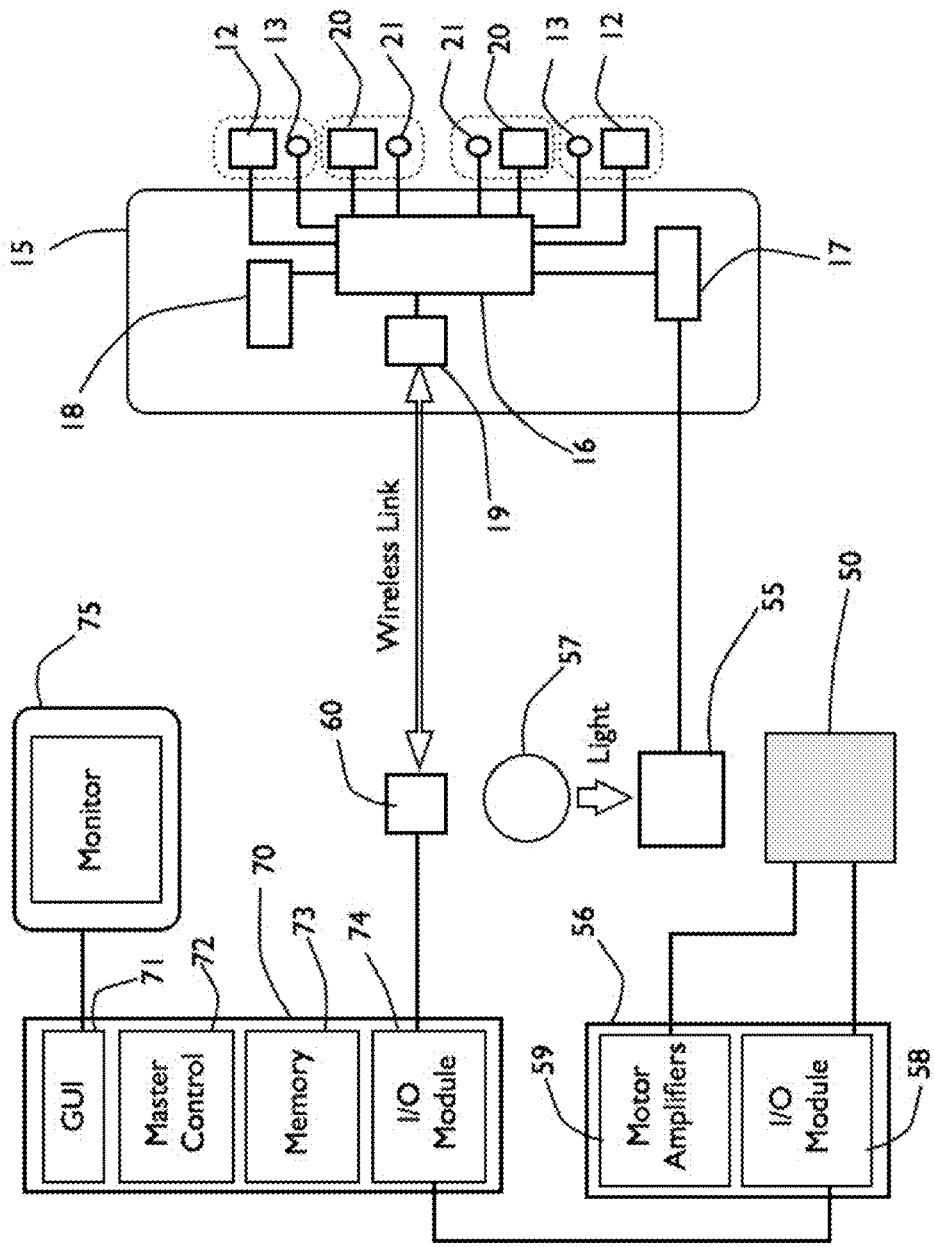
FIG. 4 is a schematic of the sensors, illuminators, data processing and control module, along with signal and power connections from the robot assembly across the vacuum to the outside of the vacuum processing system and onward to the process system controller and robot controller.

FIG. 4 shows the schematic for the data processing and control module 15 and its connections to the process system controller 70 and robot controller 56. The schematic represents one possible arrangement for the invention. Those skilled in the art of digital electronics will recognize that many changes in construction and widely differing embodiments and applications in data processing and control architecture will make themselves known without departing from the spirit and scope of the invention. The disclosure and the description herein are purely illustrative and are not intended to be in any sense limiting.

The preferred embodiment of the invention is to utilize the data processing and control module 15 to do the real time processing of the sensors 12 and 20 signals and the corresponding data analysis to calculate the correction dimensions for the robot 50 which is fed back to the process system controller 70 for corrective action. The advantage of this embodiment is speed as only simple numerical values need be communicated as opposed to multi-bit data for each of the multi-pixels from the sensor arrays 12 and 20. There may be situations where other dictates on the system might make it advantageous to process the raw pixel data in the process system controller 70 or the robot controller 56.

The data processing and control module 15 comprises 4 sub-modules; the processing sub-module 16, the memory sub-module 18, the internal vacuum wireless communication sub-module 19 and the power management sub-module 17. The preferred embodiment of the invention is to mount the data processing and control module 15 onto the end effector assembly 10 to minimize the length of signal and power cables from this module 15 to the sensors 12, 20 and to the illuminators 13, 21. In practice, module 15 could be mounted elsewhere on the robot assembly 50.

The processing sub-module 16 utilizes a commercially available Field Processing Gate Array (FPGA) which is programmed to control the operation of the sensors 12, 20 and illuminators 13,21, process the pixel signals from the sensors 12, 20, analyze as required the individual pixel data, retrieve and store data in the memory sub-module 18 and receive and send signals via the wireless communication sub-module 19. While a FPGA is the preferred embodiment of the invention, a microprocessor, digital signal processor (DSP) or alternately a uniquely designed application specific integrated circuit (ASIC) could be substituted.

The memory sub-module 18, in the preferred embodiment, provides non-volatile memory for storing key data such as, and not limited to, calibration dimensional data, individual sensors' pixel calibration data, pixel grey level definitions for image analysis and other parameters required for the operation and analysis of the microprocessing sub module 16. An alternative implementation would utilize dynamic random access memory (DRAM), with permanent data residing at the process system controller 70 in the memory module 73 on a non-volatile memory device such as a hard drive or flash memory. This permanent data would be loaded into the DRAM of the memory sub-module 18 as required.

The internal vacuum wireless communication sub-module 19 is used to send and receive signals in communication, via the wireless communication sub-module 60, with the process system controller 70. Band width of the wireless communication will depend on the amount of data to be transferred, i.e. number of pixels, number of bits per pixel, frame rate and number of sensors. The preferred embodiment of this invention utilizes a broad band communication system such as WiFi to take advantage of the cost effective high data rate chips available to enable real time, good quality video from the sensors 12, 20. Utilizing a wireless link solves one of the major challenges of communicating from the atmospheric side of a vacuum processing system with the robot's end effector assembly 10 in vacuum. Wafer transfer robots 50 used inside vacuum processing systems are predominantly physically isolated from the outside atmosphere. Robot motive force is typically provided by magnetic means to avoid the use of mechanical shafts and seals which can lead to contamination and leaks in the vacuum processing system. These robots also need the flexibility to rotate randomly in any direction. This means that it is not feasible to bring power or signals from the outside of the vacuum processing system to the robot assembly 50 inside the processing system using cables. This is why all the prior art was limited to remotely sensing the location of the wafer on the end effector using interrupted light beams and or cameras. An important element of this invention provides the means to bring signals to and from the data processing and control module 15 inside the vacuum processing system.

The power management sub-module 17 regulates the incoming power and provides the appropriate voltages required for the semiconductor devices and passive components on the data processing and control module 15, the sensors 12, 20 and illuminators 13, 21 on the end effector assembly 10. The other limitation, other than signal communication, of the prior art for putting sensors and other electrical devices onto the end effector assembly 10 in vacuum was the problem of providing power. The preferred embodiment of this invention is shown in the schematic in FIG. 3 and partially in FIG. 4. A photovoltaic cell assembly 55 is mounted to the top of the robot assembly 50. A light source 57 on the external wall of the vacuum processing system chamber containing the robot assembly 50 provides the light input to power the photovoltaic cell assembly 55. The choice of photovoltaic cell is a trade off between power required, space available and cost. For example a mono crystalline silicon based photovoltaic cell has a typical energy conversion efficiency of 19% to 24% while a compound semiconductor photovoltaic cell efficiency may approach 40% however the cost of the higher efficiency cell module may be 10× of the lower efficiency silicon based photovoltaic module. The power is delivered to the end effector assembly 10 by a cable that passes along the arms of the robot and terminates at the power management sub-module 17 on the data processing and control module 15. A typical embodiment of the invention is expected to consume 10 Watts or less. In certain operating configurations of the invention, for example only operating for one or two seconds when the end effector assembly 10 is at a designation point for wafer hand off, the average power consumption may be reduced by over 50%. In this case, energy storage elements such as a capacitor or rechargeable battery may be used to reduce the average power capability required by the photovoltaic power system.

Figure 3:
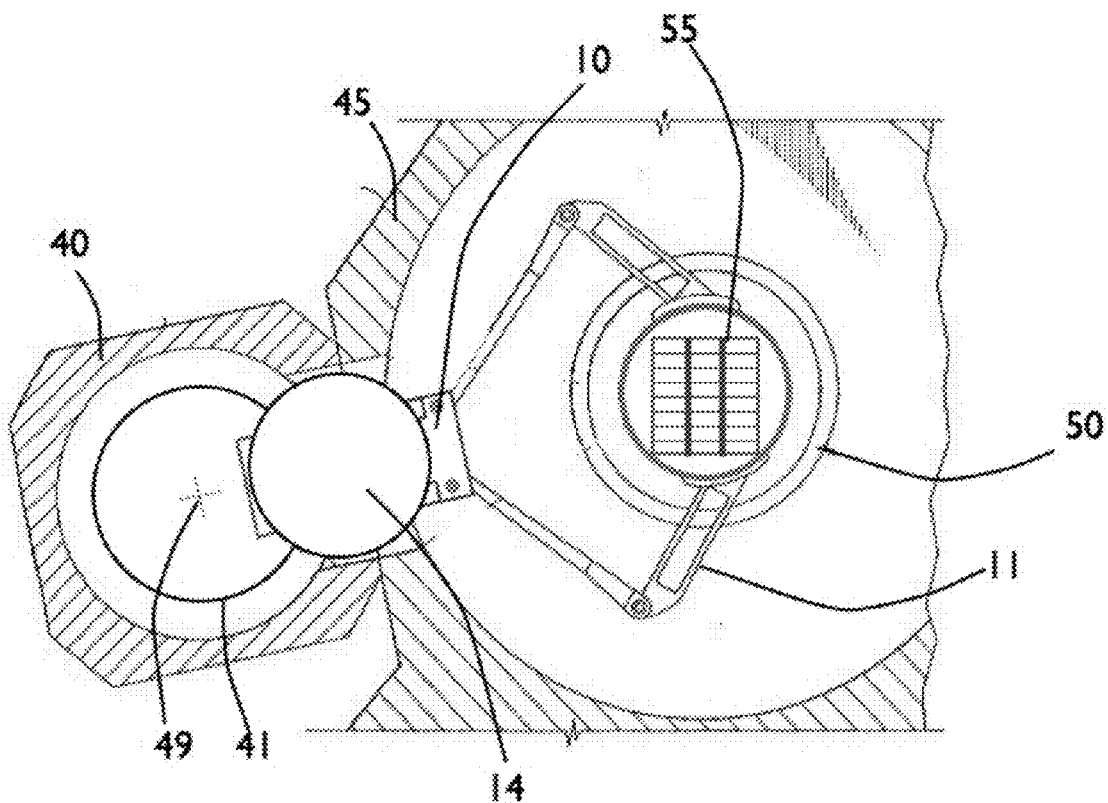
FIG. 3 is a partial plan view of the vacuum processing system showing one process chamber attached to the chamber containing the wafer transfer robot, the transfer robot's end effector assembly moving a wafer between chambers and the photovoltaic electricity generating cells mounted to the transfer robot.

FIG. 3 illustrates the photovoltaic cell assembly 55 mounted concentric to the axis of the robot assembly 50. In the case of wafer transfer robot architectures where it is not possible to mount the photovoltaic cell module 55 concentrically on the top of the robot 50, then the photovoltaic module 55 should be mounted onto a robot arm 11 as close as practical to the axis of the robot. The power providing light source 57 would then be focused to provide the appropriate amount of annular illumination power. In this power configuration, power providing light is not limited to coming from the top of the vacuum processing system.

The preferred embodiment of the invention utilizers a photovoltaic power system for its ease of use, flexibility and low cost. In certain robot design configurations it may be possible to substitute an induction power providing system with appropriate AC to DC power rectification on the robot assembly.

In certain limited robot design configurations where the robot rotation motion is constrained to move backwards and forwards with limited annular rotation, a flexible cable could be used to provide power and signal communication to the robotic assembly 50.

The control architecture illustrated in FIG. 4 utilizes the process system controller 70 to direct the operations of the robot 50 through the robot controller 56 which is comprised of the motor amplifiers 59 and I/O module 58 for communicating with the robot assembly 50 encoders and process system controller 70. The process system controller 70 comprises a master controller 72 which executes the software programs, a memory module 73 to store programs and data, an I/O module 74 for signal communications and a GUI (Graphical User Interface) module 71 for interfacing with the operator via the monitor 75.

The presence of the data processing and control module on the robot assembly 50 and the end effector assembly 10 enables further enhancements to the wafer transfer robot over the prior art. As an example, a small accelerometer sensor can now be incorporated into the end effector assembly to provide real time feedback on the smoothness and acceleration profiles experienced by the wafer. The accelerometer sensor's signals can be processed and communicated from the robot assembly and end effector assembly to the system controller. This invention allows other sensors to be mounted into the end effector for diagnostics and other uses inside a closed vacuum system. Examples being, measuring temperature, local vacuum gas pressure, gas flow velocities, chemical species and plasma parameters.

The following method to use this invention consists of two aspects:

Calibration of the Sensors 12, 20.

Operational Usage to Precisely Position the Wafer at Target Position.

It is assumed in the following method descriptions that one facing sensor 12 is used and two pedestal facing sensors 20 are used unless otherwise stated. This is to aid the explanation of the method. In practice, other combinations of numbers of sensors may be used. Also, sensor 20 may in some configurations face in an orientation away from the pedestal. For example in may be more important for the wafer to be aligned to some feature above the pedestal such as a gas shower head. The basic method of calibration and use still apply.

Calibration of the wafer facing sensors 12 and 20 on the end effector assembly 10 is performed when the end effector assembly 10 is first built or if physical changes are made to the end effector assembly 10. Calibration does not require the end effector assembly 10 to be mounted to the robot assembly 50.

Figure 5:
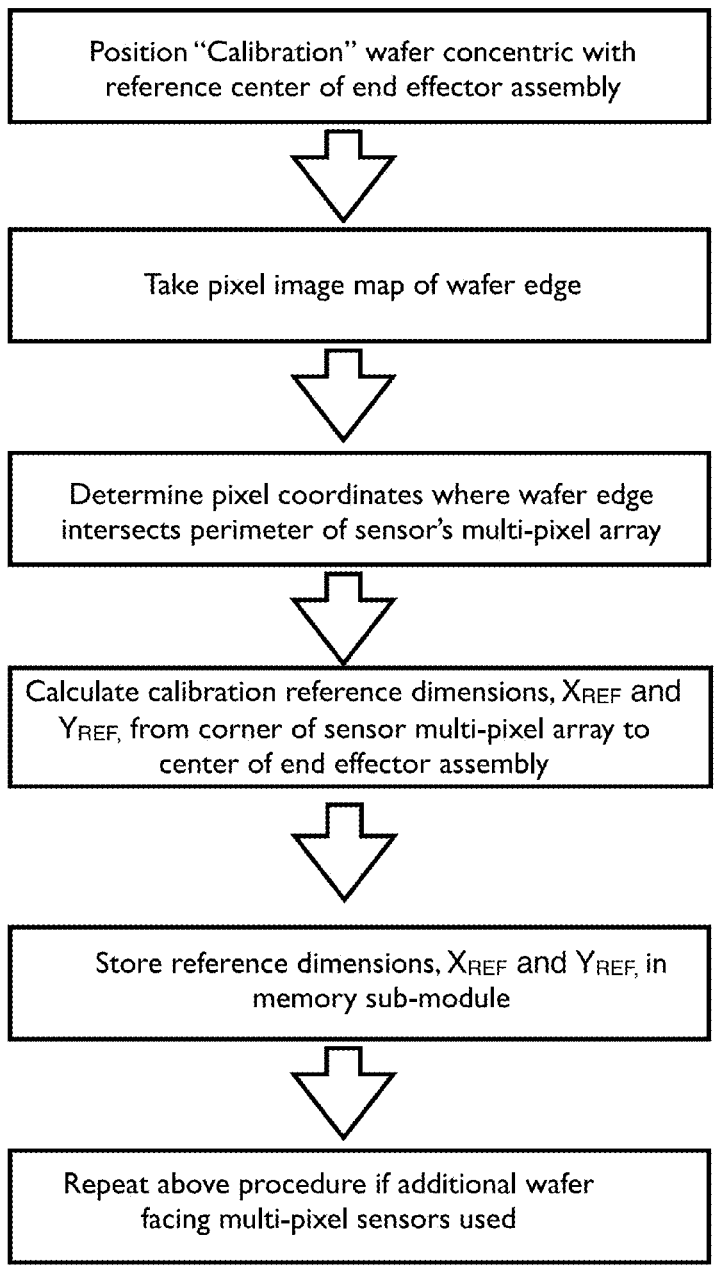
FIG. 5 is a flow chart for the calibration of the wafer facing multi-pixel sensor.

FIG. 5 shows the flow diagram for the calibration of the wafer facing multi-pixel sensor 12. First, a calibration wafer or disk with a diameter precisely measured, typically to a tolerance of plus or minus 0.025 mm or better, with a center hole is placed upon the end effector assembly 10 and aligned to the center point 25 of the end effector assembly. A preferred method is to put a closely fitting pin through the hole in the calibration wafer and locate the pin into the center hole 22 on the end effector blade assembly 10. The accurately measured diameter is inputted into the calibration routine.

Figure 6A:
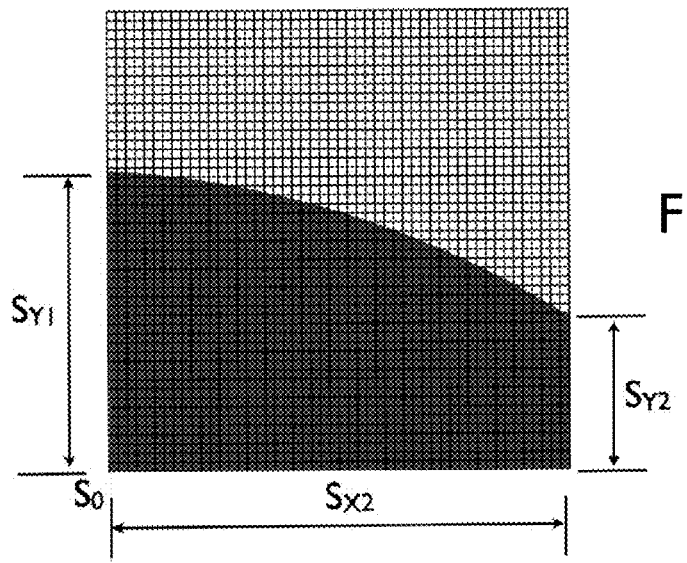
FIG. 6A is the pixel image from the wafer facing multi-pixel sensor which is partially obscured by the wafer and showing the array dimensions to be determined relative to the reference corner.

Second, a calibration routine is run on a suitably programmed computer that instructs the data processing and control module 15 to take an image of the calibration wafer or disk edge with the wafer facing multi-pixel sensor 12, as shown in FIG. 6A.

The firmware in the processing sub-module 16 compares each pixel's bit count for light intensity to determine if the pixel is obscured by the calibration wafer or not. There are four categories of pixel light level. Firstly, defective pixels locations are predetermined, stored in the memory sub-module 18, and eliminated from consideration during the edge determination analysis. Secondly, fully obscured pixels where a threshold bit level for defining a fully obscured pixel is predetermined and stored in the memory sub-module 18. This threshold level is normally just above the electrical noise level for the pixel. Thirdly, fully exposed pixels, where the bit level of light measured will depend on the illumination level during the calibration. Fourthly, partially obscured pixels under the exact physical edge of the wafer with varying bit levels of light detected. The firmware in the processing sub-module 16 will determine the coordinates $S_{Y1}$, $S_{Y2}$, and $S_{X2}$ by determining the last fully obscured pixels in the first and last column of the pixel array. For example, assume the array is 250 by 250 pixels with each pixel on a 25 micron pitch with the wafer edge crossing both side edges of the pixel array as shown in FIG. 6A and that the last fully obscured pixels are 180 and 70 pixels above the multi-pixel array origin $S_0$ in the first and last pixel columns. The next pixel up on the first column has a bit light level 25% of the difference between the threshold bit level of a fully obscured pixel and a fully illuminated pixel. The distance $S_{Y1}$ would be 180 times 25 microns plus 25% of 25 microns equaling 4506 microns. A similar calculation would be undertaken for the last column to calculate $S_{Y2}$. The ability to extrapolate dimensions based upon fractional levels of light in a pixel enable this invention to greatly increase the accuracy of wafer position sensing over the prior art.

In the case of defective pixels present near the wafer edge, the firmware uses the bit data from adjacent pixels to extrapolate the bit light level at the defective pixel location.

Figure 6B:
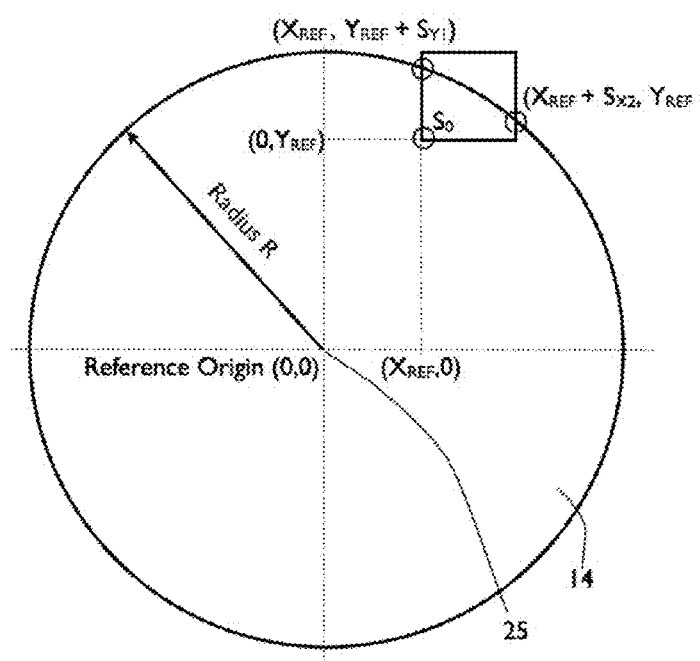
FIG. 6B is the geometric analysis diagram for determining offset dimensions of the wafer facing sensor relative to the coincident center points of the calibration wafer and end effector assembly.

Once the dimensions, $S_{Y1}$, $S_{Y2}$, and $S_{X2}$, for the intersections of the edge of the calibration wafer on the wafer facing sensor 12 multi-pixel array are determined, the firmware uses these values to determine the absolute calibration distances, $X_{REF}$ and $Y_{REF}$, from the sensor 12 array origin point $S_0$ to the reference center point 25 of the end effector assembly 10 as shown in FIG. 6B. The reference origin coordinates for center point 25 are 0,0.

The firmware utilizes the equation for a circle, $X^2+Y^2=R^2$, where R is the measured radius of the calibration wafer, and $S_{Y1}$, $S_{Y2}$, and $S_{X2}$, to calculate the calibration dimensions, $X_{REF}$ and $Y_{REF}$.

The absolute calibration dimensions, $X_{REF}$ and $Y_{REF}$ are stored in the memory sub module 18.

Figure 7:
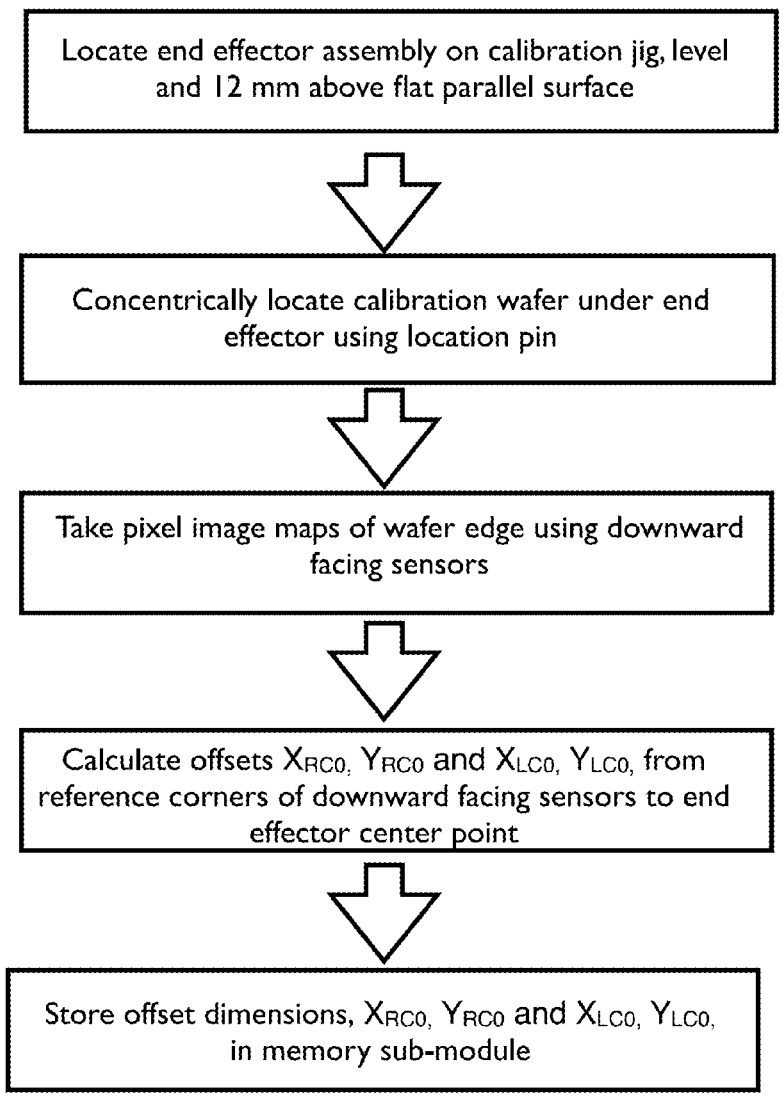
FIG. 7 is a flow chart for the calibration of the pedestal facing multi-pixel sensor.

FIG. 7 shows the flow diagram for the calibration of the pedestal facing multi-pixel sensor 20 relative to the center point 25 of the end effector assembly 10.

The end effector assembly 10 is mounted in a jig which ensures the portion of the end effector that would hold the wafer is level. The end effector is held at a fixed distance of around 10 mm above the surface below. The calibration wafer or disk is placed under the end effector. A closely fitting pin is placed through the hole 22 in the end effector assembly 10 the center hole in the calibration wafer or disk.

Figure 8A:
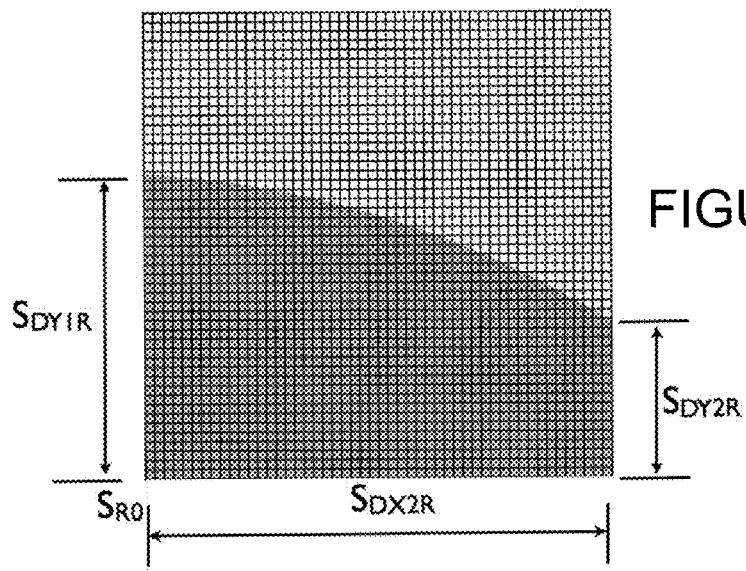
FIG. 8A is the pixel image from the pedestal facing sensor of a portion of the edge of a calibration wafer.

Next, a calibration routine is run on a suitably programmed computer that instructs the data processing and control module 15 to take images of the calibration wafer edge with sensors 20. The image from the right hand sensor 20 is shown in FIG. 8A.

Figure 8B:
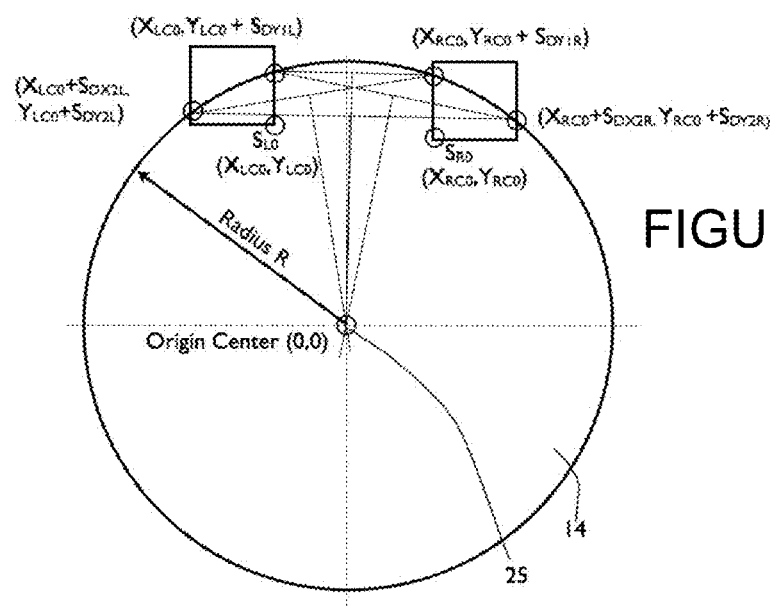
FIG. 8B. is the geometric analysis diagram for determining offset dimensions of the pedestal facing sensor relative to the coincident center points of the calibration wafer and end effector assembly.

The dimensions of the intersection points for the right and left sensors 20, $S_{DY1R}$, $S_{DX2R}$ and $S_{DY1R}$ and $S_{DY1L}$, $S_{DX2L}$ and $S_{DY1L}$, where the calibration wafer edge crosses two array edges of the sensor 20 are now determined by the data processing and control module 15 using the edge analysis method as discussed above for the wafer facing sensor 12. The offset coordinate dimensions, ($X_{RC0}$, $Y_{RC0}$) and ($X_{LC0}$, $Y_{LC0}$) for the right and left sensors 20 are then determined using the geometry analysis illustrated in FIG. 8B. The simple circle theorem that the perpendicular bisector, of a circle's chord, passes through the center point of the circle is used Four chords and associated bisecting perpendicular lines passing through the center of the wafer are Illustrated in FIG. 8B. The four geometric equations represented by these four chords is sufficient to calculate the offset coordinates, ($X_{RC0}$, $Y_{RC0}$) and ($X_{LC0}$, $Y_{LC0}$) for the right and left sensors 20 origin points to the reference center point 25 of the end effector assembly 10 as shown in FIG. 6B. The reference origin coordinates for center point 25 are 0,0. It is assumed that the center point of the calibration wafer and the center point 25 of the end effector assembly are coincident.

For additional accuracy additional cords, as measured by the multiple other points where the wafer 14 edge is detected by the individual pixels on the sensors 20, can be utilized in additional calculations.

The absolute calibration dimensions for the sensors 20, ($X_{RC0}$, $Y_{RC0}$) and ($X_{LC0}$, $Y_{LC0}$), are stored in the memory sub module 18.

The following describes an operational method for this invention.

Figure 9:
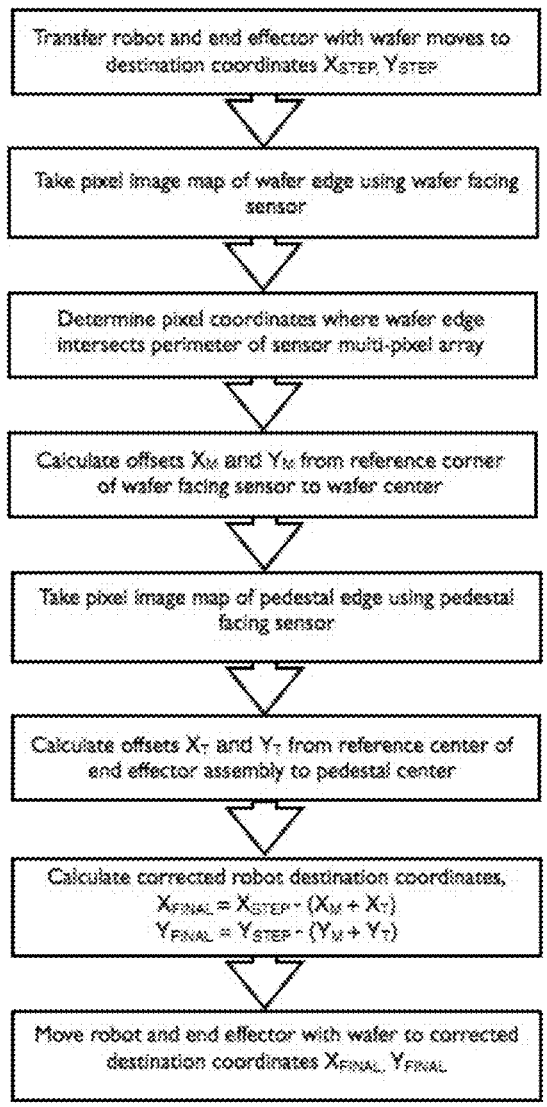
FIG. 9 is a flow chart for transferring a wafer to a target destination and using the sensors to correct final position.
Figure 10:
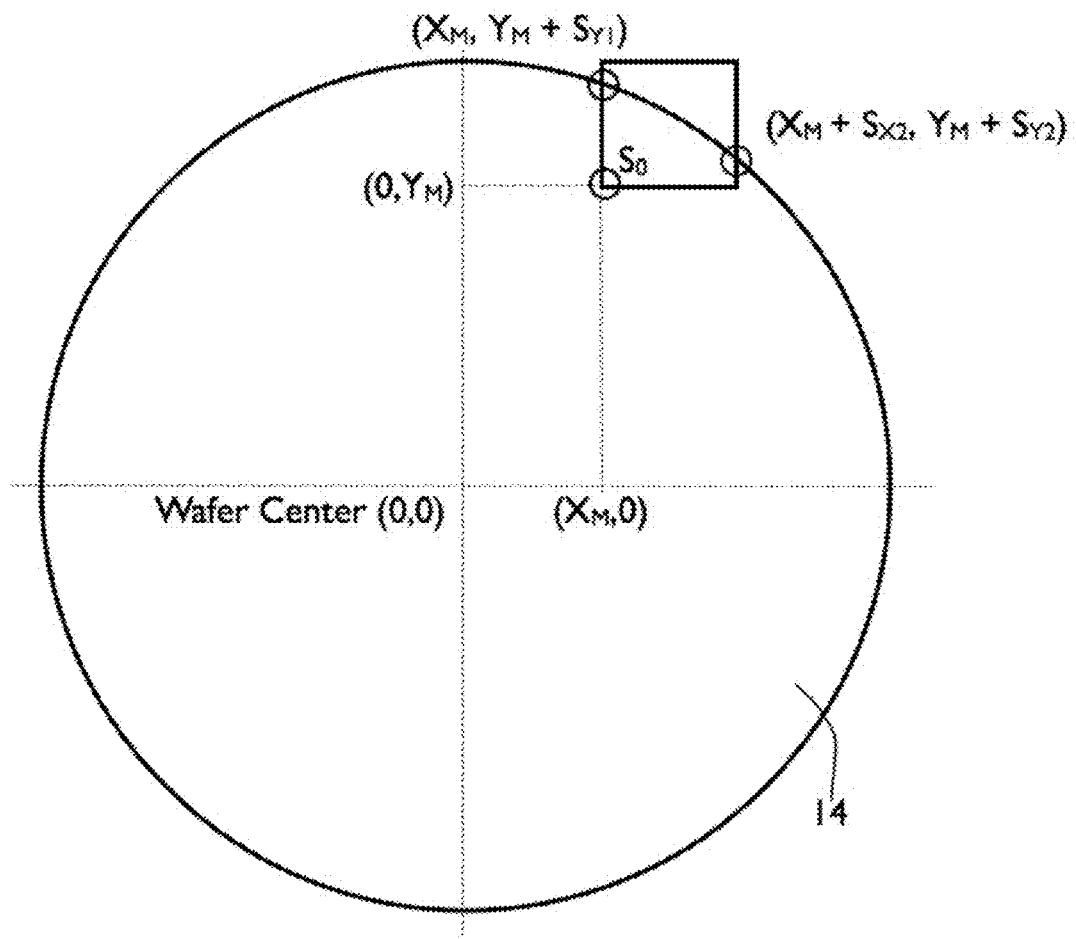
FIG. 10 is the geometric analysis diagram for determining offset dimensions of the wafer center point relative to the wafer facing sensor's array reference point.

FIG. 9 shows the flow diagram for the use of this invention for the accurate placement of a wafer at a target destination point.

The process system controller 70 instructs the robot controller 56 to transfer the wafer 14 using the wafer transfer robot 50 and its end effector assembly 10 to the target coordinates, $X_{STEP}$, $Y_{STEP}$, above the destination pedestal 41.

Once the end effector is above the pedestal 41, the process system controller 70 next instructs the data processing and control module 15 determine the offset dimensional coordinates, $X_W$ and $Y_W$, for the center point 49 of the pedestal 41 relative to the center point of the wafer 14 sitting on the end effector assembly 10.

The data processing and control module 15 turns the illuminator 13 on and using the wafer facing sensor 12 takes an image of the edge of wafer 14. FIG. 6A illustrates such an image.

If wafers with a notch in the circumference are used then the next step in the routine would be that data for each pixel which is shadowed would be analyzed and curve fitted against the equation for a circle, $X^2+Y^2=R^2$. Shadowed pixels not aligned to the curve by a minimum tolerance, typically about 50 micron or equivalent to one pixel pitch size would be eliminated as data points. The missing data points would then be back substituted by extrapolation against the equation for a circle.

The firmware next performs a similar analysis as used to calibrate the wafer facing sensor 12 calibration dimensions. Once the dimensions, $S_{Y1}$, $S_{Y2}$, and $S_{X2}$, for the intersections of the edge of the wafer 14 on the wafer facing sensor 12 multi-pixel array are determined, the firmware uses these values to determine the dimensional coordinates, ($X_M$ and $Y_M$), from the sensor 12 array origin point $S_0$ to the center point of the wafer 14 shown in FIG. 5b.

The firmware utilizes the equation for a circle, $X^2+Y^2=R^2$, and $S_{Y1}$, $S_{Y2}$, and $S_{X2}$, to calculate $X_M$ and $Y_M$.

The offset dimensions, $X_W$ and $Y_W$, of the center point of wafer 14 to the center point 25 of the end effector assembly 10 are then calculated as follows:

$$X_W = X_{REF} - X_M$$

$$Y_W = Y_{REF} - Y_M$$

Next, the data processing and control module 15 turns the illuminators 21 on and using the pixel data from pedestal facing imaging sensors 20 and the associated calibration dimensional coordinates ($X_{RC0}$, $Y_{RC0}$) and ($X_{LC0}$, $Y_{LC0}$) relative to the center point 25 of the end effector assembly 10, determines the offset dimensional coordinates, ($X_T$, $Y_T$) between the center point 49 of the pedestal 41 and end effector assembly 10 center point 25. FIG. 8A illustrates such an image from the right hand sensor 20.

Figure 11:
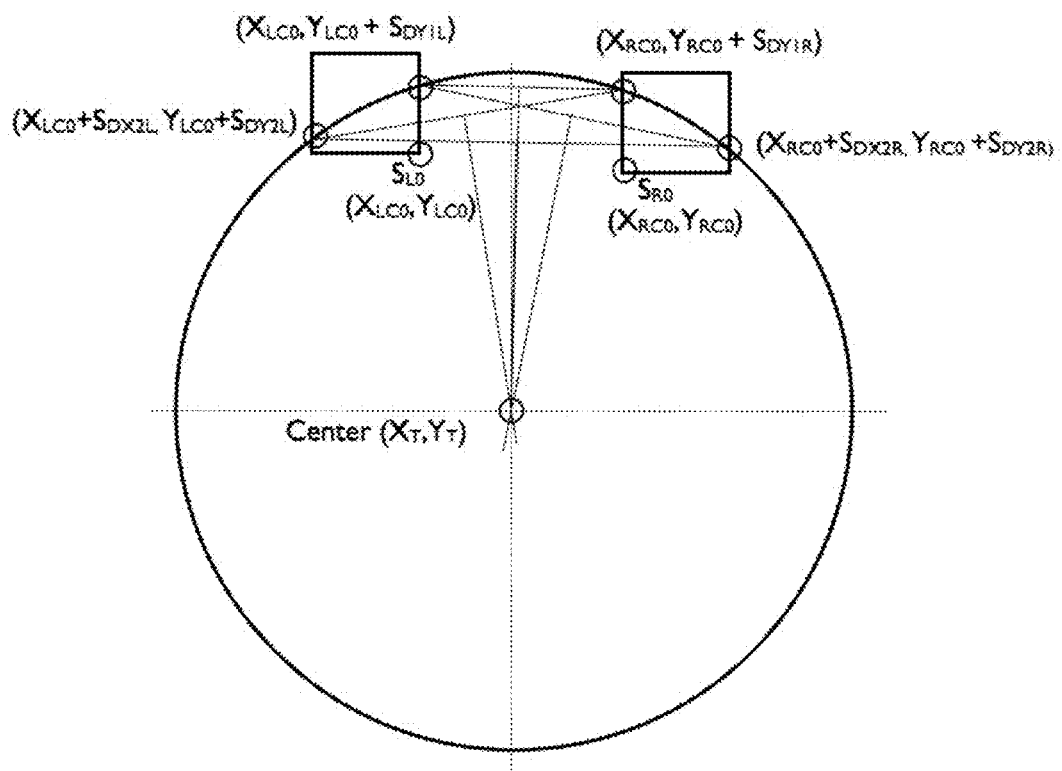
FIG. 11 is the geometric analysis diagram for determining offset dimensional coordinates of the destination pedestal center point relative to the end effector assembly center point.

The data processing and control module 15, using the edge analysis method as discussed above for the wafer facing sensor 12 calibration, determines the dimensions of the intersection points for the right and left sensors 20, $S_{DY1R}$, $S_{DX2R}$ and $S_{DY1R}$ and $S_{DY1L}$, $S_{DX2L}$ and $S_{DY1L}$, where the pedestal edge image crosses the array edges of the sensors 20. ($X_T$, $Y_T$) are determined using the geometry analysis illustrated in FIG. 11. The simple circle theorem that the perpendicular bisector, of a circle's chord, passes through the center point of the circle is used Four chords and associated bisecting perpendicular lines passing through the center of the wafer are Illustrated in FIG. 11. The four geometric equations represented by these four chords is more than sufficient to calculate the offset coordinates, $X_T$ and $Y_T$. For additional accuracy additional cords, as measured by the multiple other points where the pedestal 41 edge is detected by the individual pixels on the sensors 20, can be utilized in additional calculations.

$X_W$, $Y_W$ and $X_T$, $Y_T$ are then communicated from the data processing and control module back to the process system controller 70 which in turn directs the robot controller 56 to move the robot to final dimensional coordinates $X_{FINAL}$ and $Y_{FINAL}$.

$$X_{FINAL} = X_{STEP} - (X_W + X_T)$$

$$Y_{FINAL} = X_{STEP} - (Y_W + Y_T)$$

Next the wafer transfer robot 50 and associated pedestal wafer exchange mechanism transfer the wafer 14 from the end effector assembly 10 onto the pedestal 41. The wafer transfer robot 50 then moves on to its next destination under the control of the process system controller 50.

Vacuum robots effectively run in open loop. The robot controller sends power to the robot's motors to move the robot to target designations and monitors the robots response by encoders connected to the motors. It is assumed there is a "rigid" link between the robot's motors and encoders and the end effector assembly. In practice, there can be hysteresis due to the magnetic coupling between the robot assembly in vacuum and the motors and encoders in atmosphere. The downward facing sensors 20 can be used to provide real time positional feedback on the actually position of the robot end effector assembly 10 for corrective control action. Suitable index features would be placed under the path of the end effector assembly 10 in any part of the process system where the end effector assembly is desired to be moved.

A further modification of the operational method is to just utilize the wafer facing sensor 12 to determine the wafer 14 position on the end effector assembly 10 and rely on the prior art for determining the end effector assembly 10 position. The offset dimensions of the wafer 14 center to the end effector assembly 10 center 25 can then be used to correct the robot's final position. Likewise, the prior art for determining the wafer position on the end effector assembly could be used in conjunction with sensor 20 to determine the actual position of the end effector assembly 10 to the destination target point.

An additional benefit to this invention is that the method of using the wafer facing sensor 12 can be modified to continuously measure and monitor the position of the wafer 14 on the end effector assembly 10 to ensure that no wafer slippage is occurring. Wafer slippage is undesirable as it can lead to particulate contamination.

Figure 12:
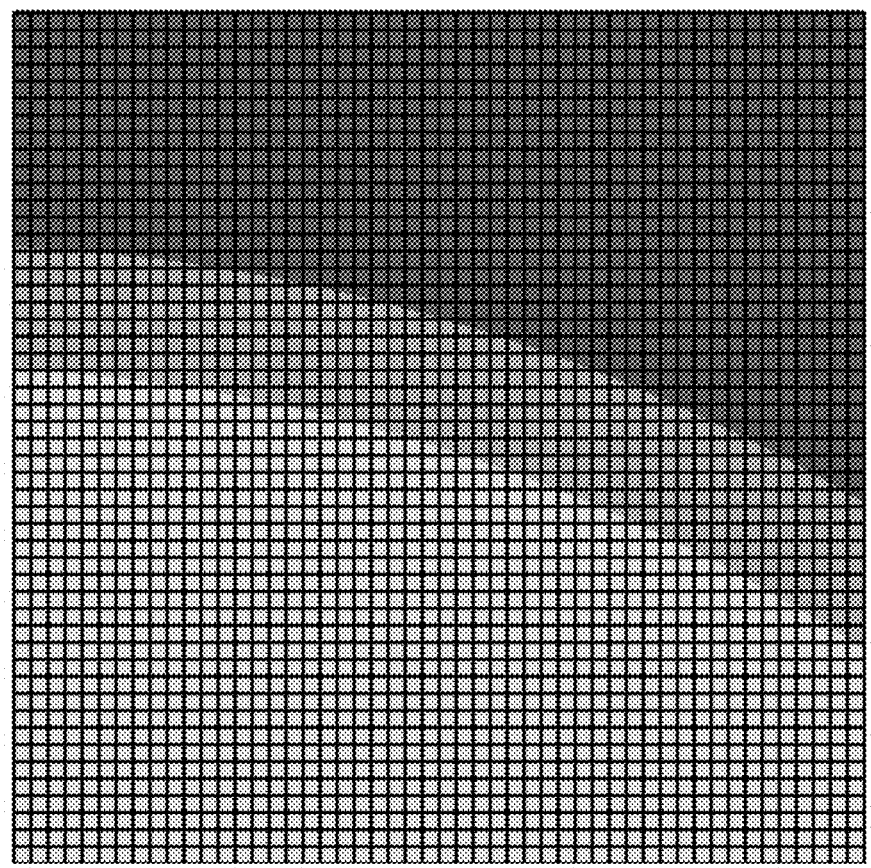
FIG. 12 is the pixel image from the righthand pedestal facing sensor of a portion of the edge of the pedestal with a wafer sitting on it.

A further benefit of this invention is that it now provides the means to a very valuable method for determining the final target coordinates, $X_{STEP}$, $Y_{STEP}$, for the robot. In spite of accurately aligning the end effector assembly 10 center point to the pedestal 41 center point 49, the act of transferring the wafer from the end effector assembly 10 to the pedestal 41 using the wafer exchange mechanism may introduce some misalignment. Wafer exchange mechanisms usually consist of either pins or wafer edge pickups which lift the wafer from the end effector. The end effector is then withdrawn from under the wafer and the pins or edge pickups lowered to lower the wafer 14 onto the pedestal 41. This invention allows a method to determine the actual wafer position on the pedestal. The end effector assembly would be moved back above the wafer 14 and pedestal 41. The sensors 20 would image both the edge of the pedestal and the wafer and utilizing the methods described above determine the dimensional offset of the wafer and pedestal center points. FIG. 12 illustrates such an image. This procedure can be repeated several times to verify that any offset was consistent and the target coordinates, $X_{STEP}$, $Y_{STEP}$, for the robot could be modified accordingly. If the wafer exchange mechanism is behaving inconsistently, then the cause can be trouble shot and rectified. The alternative to this method using the prior art would require venting, opening, closing and vacuum pumping the chamber multiple times which is a time consuming and manual act.

While this invention benefits robotic substrate transfer in a vacuum processing system, it also addresses a short coming in the state of the art for atmospheric substrate transfer robots. State of the art atmospheric transfer robots typically firmly locate the substrate on the robot's end effector by either using a vacuum chuck to hold the substrate down against the end effector or they grip the edge of the substrate using moveable shoes. They then utilize beam systems or cameras like the prior art in vacuum systems to determine the substrates actual position relative to the end effector. In certain instances, this physical clamping is undesirable and the substrate has to be moved slowly so that the substrate does not slip on the end effector and invalidate the substrate sensing system's accuracy. This invention solves this problem and allows for more accurate positioning of the substrate by the robot in unclamped substrate applications.

To those skilled in the art to which this invention relates, many changes in construction and widely differing embodiments and applications of the invention will make themselves known without departing from the spirit and scope of the invention. The disclosure and the description herein are purely illustrative and are not intended to be in any sense limiting.

What is claimed is:
1. A sensing system for accurately positioning a substrate at a preselected location inside a process system comprising:
   a substrate transfer robot including an end effector for carrying the substrate;
   a system controller for instructing the substrate transfer robot to follow prescribed trajectories and capable of accepting position correction data to modify robot's path;
   at least one or more substrate edge facing multi-pixel sensors mounted to the end effector assembly and proximity focused onto a portion of the substrate edge;
   at least one or more imaging sensors and associated optics, mounted to the end effector assembly, and focused on physical features at the preselected location;
   data processing and control electronics, mounted on the substrate transfer robot and end effector assembly, for operating and processing the signals from the imaging sensors, and communicating signals to and from the system controller;
   analyzing the images obtained from the substrate edge facing multi-pixel sensors and imaging sensors, in the data processing and control electronics, to determine the offset dimensions between the center point of the substrate and target point for substrate placement;
   feeding the offset dimensions back to the system controller for corrective action by the substrate transfer robot to ensure accurate positioning.

2. The sensing system of claim 1 wherein the substrate edge facing multi pixel sensor is an light imaging sensor based upon CMOS or CCD technology.

3. The sensing system of claim 2, wherein illuminators mounted on the end effector assembly provide illumination to provide a shadow image of the substrate edge onto the substrate facing sensor array.

4. The sensing system of claim 1, wherein the substrate facing multi pixel sensor is a multi-electrode capacitance sensor.

5. The sensing system of claim 1, wherein the imaging sensors, focused on physical features at the preselected location, are multi-pixel array sensors based upon CMOS or CCD technology.

6. The sensing system of claim 5, wherein illuminators mounted on the end effector assembly can provide illumination to the features at the preselected location.

7. The sensing system of claim 1, wherein the imaging sensors, focused on physical features at the preselected location, are light beam receivers coupled to light beam transmitters.

8. The sensing system of claim 1, wherein signal communication between the substrate transfer robot and end effector assembly and the system controller utilizes wireless communication means.

9. The sensing system of claim 8, wherein the signal communication utilizers broadband wireless means capable of transmitting images generated by the imaging sensors to the system controller for viewing.

10. The sensing system of claim 1, wherein power for operation of the sensors, illuminators and the data processing and control electronics on the substrate transfer robot and end effector assembly is provided wirelessly.

11. The sensing system of claim 10, wherein power for operation of the sensors, illuminators and the data processing and control electronics on the substrate transfer robot and end effector assembly is provided wirelessly by a light source on the process system chamber in conjunction with a photovoltaic device mounted onto the substrate transfer robot.

12. The sensing system of claim 1, wherein the preselected location is under the path of the robot's end effector assembly.

13. A method for accurately positioning a substrate inside a process system at a preselected location comprising:
carrying a substrate on an end effector assembly of a substrate transfer robot from an initial location to the preselected location specified by a system controller;
imaging a portion of the edge of the substrate by one or more substrate facing multi-pixel sensors mounted to the end effector assembly;
imaging features related to the center point at the preselected location with one or more imaging sensors located on the end effector assembly and focused on preselected location features;
determining the difference in position between the center point of the substrate and the center point of the preselected location features using data analyzing electronics located on the substrate transfer robot and end effector assembly;
feeding the difference in position data back to the system controller to enable repositioning of the robot to ensure the substrate is positioned accurately at preselected location.

14. The method of claim 13, wherein the substrate facing multi-pixel sensors and imaging sensors on the end effector assembly are dimensionally pre-calibrated and do not require calibration inside the process system.

15. The method of claim 13, wherein determining a difference in position comprises comparing the center point of the substrate relative to the center point of the end effector assembly versus the center point of the preselected location features relative to the reference center point of the end effector.

16. The method of claim 13, wherein the images obtained from the substrate facing multi-pixel sensors and imaging sensors on the end effector assembly are communicated back to the system controller and displayed on a monitor for viewing and diagnostics.

* * * * *